United States Patent [19]
Zuniga et al.

[11] Patent Number: 5,664,497
[45] Date of Patent: Sep. 9, 1997

[54] LASER SYMBOLIZATION ON COPPER HEAT SLUGS

[75] Inventors: Edgar R. Zuniga, Sherman; Archie W. Sutton, Howe; Ray H. Purdom, Sherman, all of Tex.

[73] Assignee: Texas Instruments Incorporated, Dallas, Tex.

[21] Appl. No.: 575,232

[22] Filed: Dec. 20, 1995

Related U.S. Application Data

[63] Continuation of Ser. No. 198,693, Feb. 18, 1994, abandoned.
[51] Int. Cl.⁶ ........................................ B41F 23/04
[52] U.S. Cl. ............................. 101/487; 101/483
[58] Field of Search .................... 101/487, 484, 101/483, DIG. 40, DIG. 43; 118/640, 641, 642, 620

[56] References Cited

U.S. PATENT DOCUMENTS

| | | | |
|---|---|---|---|
| 4,177,372 | 12/1979 | Kotera et al. | 118/641 |
| 4,592,977 | 6/1986 | Naganuma et al. | 430/18 |
| 4,834,834 | 5/1989 | Ehrlich et al. | 118/620 |
| 5,196,286 | 3/1993 | Watkins | 430/126 |
| 5,304,357 | 4/1994 | Sato et al. | 118/620 |

*Primary Examiner*—Edgar S. Burr
*Assistant Examiner*—Anthony H. Nguyen
*Attorney, Agent, or Firm*—Alan K. Stewart; Richard L. Donaldson; Wade James Brady, III

[57] ABSTRACT

The invention is to a method of placing symbolization on a heat spreader, used in conjunction with the semiconductor package, through the use of a low powered laser beam. The beam is scanned over the package surface at a preset intensity and for a desired time to change the surface texture of the heat spreader, and to change the reflectivity of the scanned area.

7 Claims, 1 Drawing Sheet

LASER SYMBOLIZATION ON COPPER HEAT SLUGS

This application is a Continuation of application Ser. No. 08/198,693, filed Feb. 18, 1994 now abandoned.

FIELD OF THE INVENTION

This invention relates to placing symbols on semiconductors, and more particularly to placing symbolization on copper heat slugs on semiconductor devices.

CROSS-REFERENCE TO RELATED APPLICATIONS

The following co-assigned patent application are hereby incorporated by reference:

| Serial No. | Filing Date | TI Case No. |
| --- | --- | --- |
| 07/973,903 | 11/10/92 | TI17109 |
| 07/973,894 | 11/10/92 | TI17108 |

BACKGROUND OF THE INVENTION

Present day methods of semiconductor symbolization to identify the semiconductor includes printing the symbolization with ink base printing machines. Several methods of printing have been used. One of the most common methods uses a solvent base, semi-liquid ink that is transferred to the molded body of an integrated circuit by means of a transfer pad which collects the ink from a reservoir, and then transfers the ink to a template with the device type identification.

The printing process requires that the surface of the encapsulated device be clean, free of oil and wax. The cleaning is usually accomplished with solvents CFCs (chlorofluorocarbons), and then heated to a specific temperature for a specific time period. After the symbolization process, the ink needs to be cured or dried. This is usually accomplished through a batch cure oven, such as a convection over, or by an ultraviolet cure process, which is required of some specially formulated ink.

The need for process simplification and an environmentally safe process provides the need for the development of new methods of device symbolization.

SUMMARY OF THE INVENTION

The invention is to a method of semiconductor device symbolization that utilizes a laser printing technology that is more efficient, cleaner, production oriented process. A laser beam is utilized to burn through a thin layer of the plastic package and to expose a heat spreader under the plastic coating. The laser process primarily changes the surface texture on the printing surface, producing a base metal color on metallic surfaces. On copper, the resulting color is yellow.

The technical advance represented by the invention, as well as the objects thereof, will become apparent from the following description of a preferred embodiment of the invention when considered in conjunction with the accompanying drawings, and the novel features set forth in the appended claims.

DESCRIPTION OF A PREFERRED EMBODIMENT

The invention is to a process for marking semiconductor devices with a low power laser. A laser beam utilizing approximately 75 kw at 1 Khz frequency is directed toward the semiconductor package. When black colored packages are exposed to the low power laser beam, the package surface has a white appearance. The laser power should be low enough to prevent burning through the oxide black coating into the base material under the black oxide coating. For copper heat spreaders, the oxide is cupric oxide.

Figure 1:
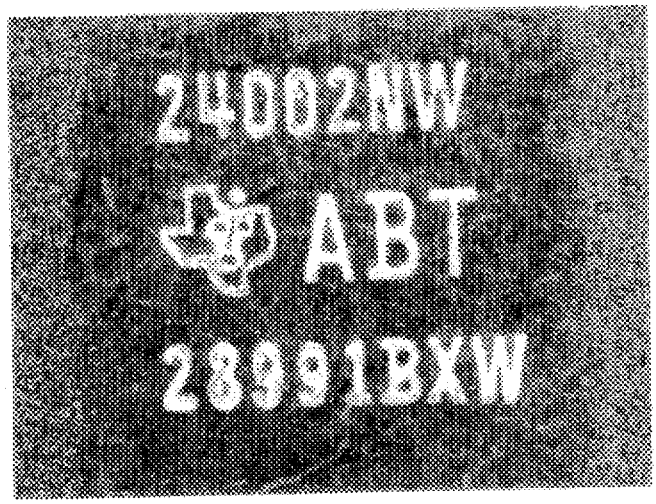
FIG. 1 illustrates a semiconductor device symbolized with ink according to the prior.

FIG. 1 illustrates a semiconductor device symbolized with conventional ink stamping. The device has lettering and symbols stamped thereon.

Figure 2:
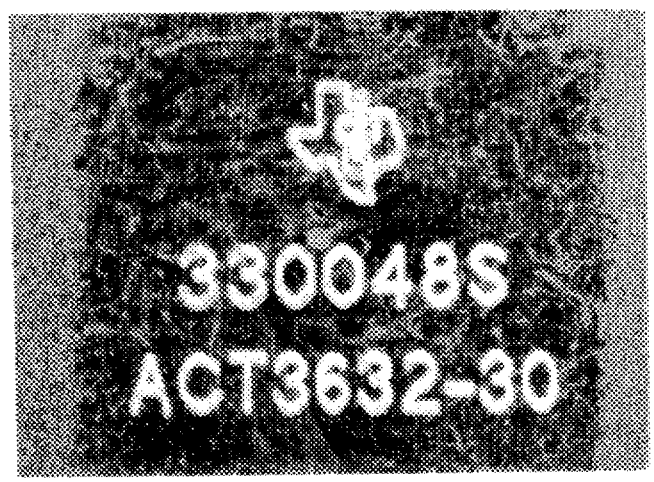
FIG. 2 illustrates a semiconductor device symbolized with laser printing.

FIG. 2 shows a semiconductor device symbolized by a low powered laser beam. The device has letters and symbols thereon. The visual appearances in the two methods of symbolization is minimal, and shows that laser printing provides a faster and cleaner method of symbolization. The surface of the semiconductor device is exposed to a low power laser beam of approximately 75 kilowatts, 12.3 amps, 4.0 Khz, at a speed of 400 millimeters per second to change the texture of the exposed areas. The total time depends upon the specific character being made and the size of the character.

If the area to be symbolized is a portion of the oxide coated heat spreader, then the laser beam has a smoothing effect, changing the texture of the laser exposed area, thereby changing the reflectivity and color of the oxide. With the change in reflectivity and color, the laser symbolization is distinct from the surrounding areas that have not been exposed to the laser beam. If the portion of the heat spreader has been coated with an epoxy such as Novolac, then the laser burns through the thin coating of epoxy, and treats the oxide on the heat sink under the epoxy.

Figure 3:
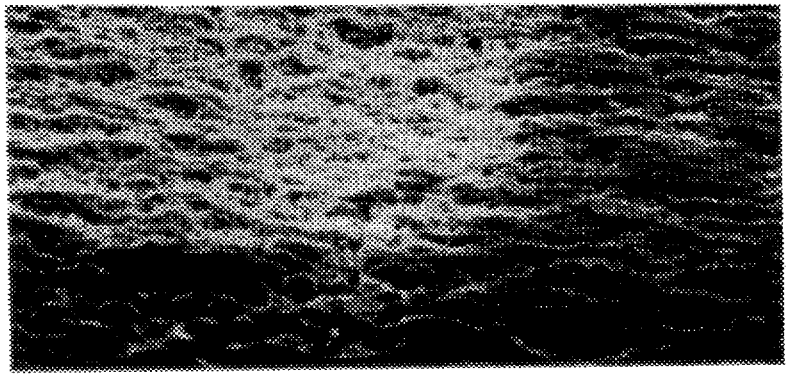
FIG. 3 is an enlarged view of the surface of a treated heat slug showing the marking effect of a low power laser beam.

FIG. 3 is a magnified view of the surface treated by laser printing. The symbol is burned directly into the coated heat slug of the semiconductor device. The lower power laser smoothes the rough surface of the treated heat slug, changing the reflectivity of the light impinging on the surface of the treated slug, producing the white color appearance.

FIG. 3 is a view magnified 2300×, and viewed at a 45 degree angle to the surface of the device. In FIG. 3, the darker zone has been marked with the lower power Laser beam, showing a different reflectivity from the unmarked area.

What is claimed:

1. A method of placing symbolization on semiconductor devices, comprising the steps of:

coating an area to be symbolized with an oxide material;

exposing a portion of the oxide material in a desired pattern with a low power Laser beam in the range of 75 kilowatts; and exposing the portion of the oxide material for a period sufficient to change a reflectivity of the portion of the oxide material without burning through the portion of the oxide material.

2. The method according to claim 1, further comprising penetrating a plastic coating with the Laser beam to symbolize the area.

3. The method according to claim 1, wherein the area to be symbolized is metal.

4. The method according to claim 3, wherein the metal is copper.

5. A method for placing symbolization on a semiconductor device package, comprising the steps of:

oxide coating a surface of the package;

tracing a desired pattern on the oxide coating with a laser beam in the range of 75 kilowatts; and maintaining the beam on the oxide coating for a time sufficient to change a reflectivity of the oxide coating without burning through the oxide coating.

6. The method according to claim 5, wherein the surface of the package is copper and the oxide coating is cupric oxide.

7. The method according to claim 5, further comprising the step of penetrating a plastic coating with the laser beam to expose the oxide coating.

* * * * *